United States Patent [19]

Nakayama

[11] Patent Number: 4,945,541
[45] Date of Patent: Jul. 31, 1990

[54] METHOD AND APPARATUS FOR CONTROLLING THE BIAS CURRENT OF A LASER DIODE

[75] Inventor: Takao Nakayama, Tokyo, Japan

[73] Assignee: Digital Equipment Corporation, Maynard, Mass.

[21] Appl. No.: 373,158

[22] Filed: Jun. 28, 1989

[30] Foreign Application Priority Data

Sep. 9, 1988 [JP] Japan .................... 63-225045

[51] Int. Cl.$^5$ .................... H01S 3/13
[52] U.S. Cl. .................... 372/31; 372/38; 455/611
[58] Field of Search .................... 372/29, 31, 38; 455/611

[56] References Cited

U.S. PATENT DOCUMENTS

| | | | |
|---|---|---|---|
| 4,355,395 | 10/1982 | Salter et al. | 372/38 |
| 4,845,720 | 7/1989 | Koishi et al. | 372/31 |

Primary Examiner—James W. Davie
Attorney, Agent, or Firm—Arnold, White & Durkee

[57] ABSTRACT

An apparatus controls the optical output intensity of a laser diode 52 used in an optical communication system. The laser diode 52 receives current from a pulse current supply 74 and a bias current supply 72. The optical output intensity of the laser diode 52 is controlled via a closed bias current control loop that includes a photodiode 50, which supplies a signal having a magnitude correlative to the optical output intensity of the laser diode 52. The closed bias current control loop monitors the trough level of the photodiode output to regulate the bias current supply 72. Thus, the output of the photodiode 50 is delivered to a means 56 for detecting the magnitude corresponding to the minimum magnitude of the optical output of the laser diode 52. The voltage corresponding to this detected low level is compared to a preselected voltage level $V_r$ and the difference in the two signals is delivered to the bias current supply through an integration circuit 66. Thus, as the optical output intensity of the laser diode 52 shifts with temperature or age degradation, the bias current supply correspondingly increases the current delivered to the laser diode 52 in order to maintain a constant optical output intensity.

23 Claims, 5 Drawing Sheets

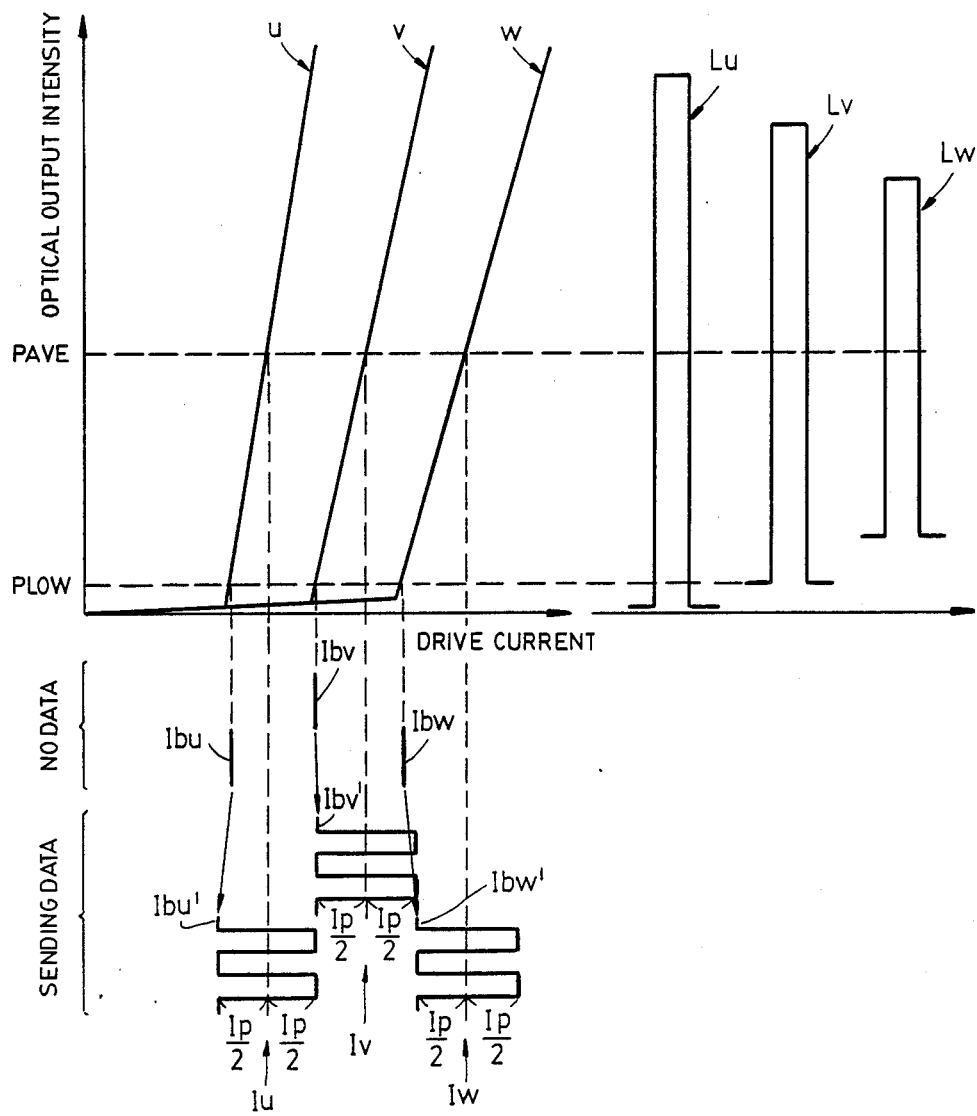

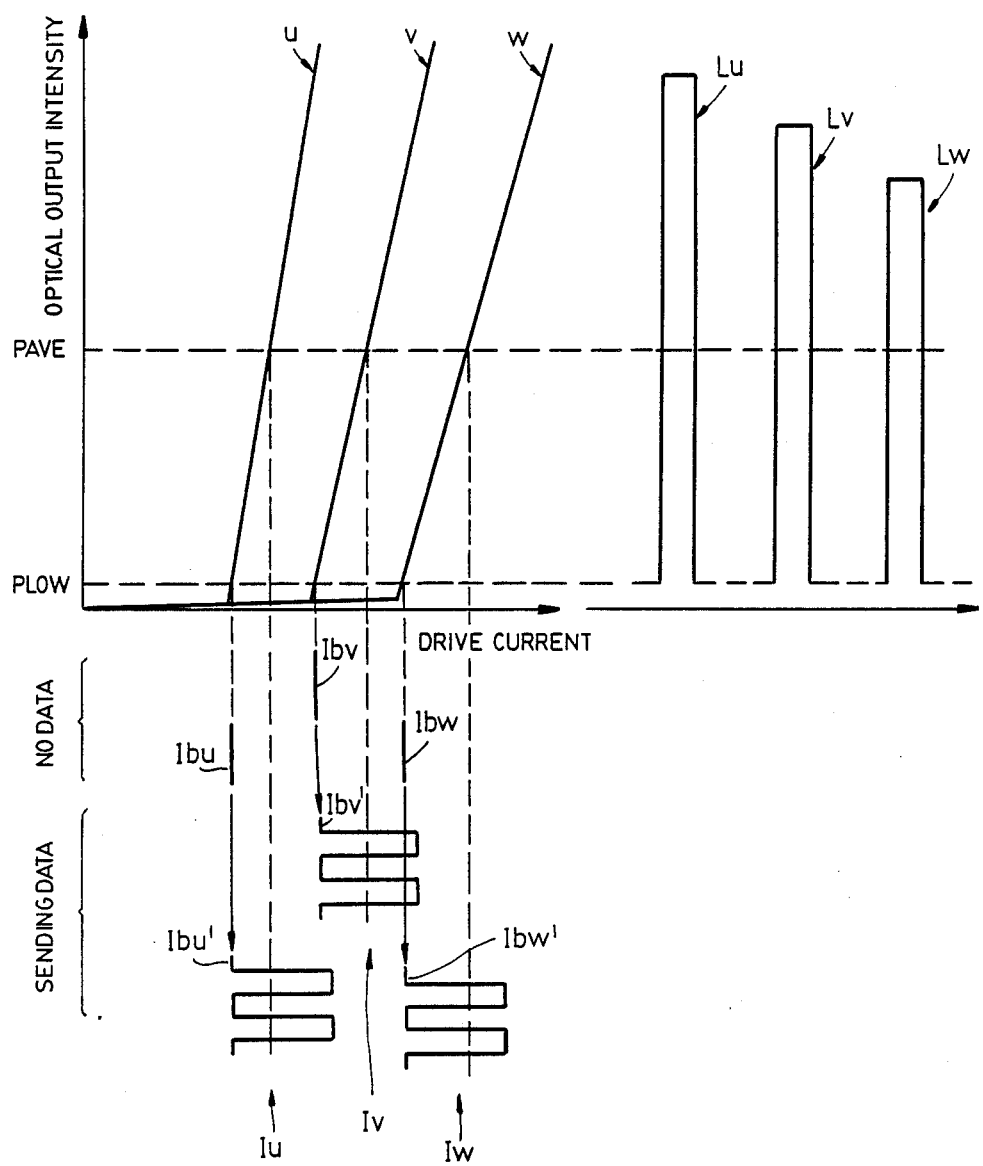

METHOD AND APPARATUS FOR CONTROLLING THE BIAS CURRENT OF A LASER DIODE

FIELD OF THE INVENTION

This invention relates generally to a method and apparatus for maintaining a desirable extinction ratio and data burst response of laser diodes used in an optical transmitter of an optical communication system or optical interconnects and, more particularly, to a method and apparatus for controlling the bias current of the laser diode to maintain the trough level of the optical output power at a preselected constant level.

DESCRIPTION OF THE RELATED ART

Laser diodes are commonly used in optical communication systems for high speed data transmission. However, laser diodes typically demonstrate strong nonlinear characteristics for variations in operating temperature. Thus, the optical output intensity of the laser diode is difficult to regulate during variations in the operating temperature.

Typically, prior art automatic power controls supply a bias current that is set at approximately the threshold current level of the laser diode. In this manner, when a pulse current is added to the bias current, the laser diode is effectively switched between a high and low optical output intensity corresponding to the wave form of the pulse current. The supplied bias current is controllably varied to be approximately at the threshold current level of the laser diode, particularly when variations in the threshold current level occur because of corresponding variations in the operating temperature of the laser diode.

In order to maintain the bias current at this desired current level, the prior devices have typically employed a mean (time-averaged) level or peak level detection and control circuit. These mean level detection circuits ordinarily monitor the optical output intensity of the laser diode, determine the average optical output intensity, and vary the bias current supply so as to maintain the optical output intensity centered about a preselected average level. These mean level detection circuits tend to operate well when data is actually being delivered, but suffer from poor response to data burst, as well as deteriorated low/high optical power ratio (extinction ratio) for increased operating temperatures. That is to say, when data is not being delivered over the optical communication system, the optical output intensity of the laser diode is allowed to sink to a preselected low level that does not necessarily correspond to the low level optical output intensity that occurs during data transmission. Since the low optical output intensity during data transmission is linked to the preselected average level and the amplitude of the optical output signal, it can be seen that it does not necessarily correspond to the preselected low value that occurs when there is no data signal and, consequently, the amplitude of the optical output signal is zero.

Accordingly, during the transition period between when data is not being delivered and when data is first being delivered there is a short period of time where the operation of the laser diode is dependent upon the operating temperature. For example, when the ambient temperature is low or the laser diode is initially operated and the operating temperature is relatively low, the low level optical output intensity is typically higher for no data transmission than when data is being transmitted. Therefore, the optical output intensity is initially greater than the desired output optical intensity. Conversely, when the ambient temperature is high or after the laser diode has been operating for a period of time and the operating temperature has correspondingly increased, the low level optical output intensity is less for no data transmission and greater during data transmission. Therefore, during high temperature operation the optical output intensity is substantially lower than the desired optical output intensity in response to the initial data burst.

Further, it should also be appreciated that the extinction ratio of these prior art mean level control circuits is proportional to the operating temperature unless some form of temperature compensation is employed. More particularly, as the operating temperature of the laser diode increases its extinction ratio increases. It should be appreciated that any noise present in the optical transmission system impacts the data transmission accuracy more significantly if the extinction ratio is larger. In particular, increased shot noise arising from the deteriorated extinction ratio increases the bit error rate of the optical receiver.

The apparatus of the invention overcomes the above problems by providing a control circuit for a laser diode that demonstrates an improved predictability in response to a data burst without adversely affecting the extinction ratio, which is simple and reliable in construction and operation.

SUMMARY OF THE INVENTION

The laser diode receives current from a pulse current supply and a bias current supply. First means receives a portion of the optical output of the laser diode and delivers a first signal having a magnitude proportional to the optical intensity of the laser diode optical output. Second means receives the first signal, detects the magnitude corresponding to the minimum magnitude of the optical output, and delivers a second signal having a magnitude corresponding to the minimum magnitude of the optical output. Finally, the apparatus includes third means for comparing the magnitude of the second signal to a preselected magnitude and altering the magnitude of said bias current in response to second signal differing from the preselected magnitude.

In another aspect of the present invention, an apparatus is provided for controlling the optical output intensity of a laser diode. The laser diode receives current from a pulse current supply and a bias current supply. The apparatus includes first means for receiving a portion of the optical output of the laser diode and delivering a first signal having a magnitude proportional to the optical intensity of the laser diode optical output. Second means receives the first signal, detects magnitude corresponding to the minimum magnitude of the optical output, and delivers a second signal having a magnitude corresponding to the minimum magnitude of the optical output. Third means compares the magnitude of the second signal to a preselected magnitude and delivers a third signal having a magnitude corresponding to the magnitude of the difference between the second signal and the preselected magnitude. Finally, the apparatus includes fourth means for receiving the third signal and altering the magnitude of the bias current corresponding to the magnitude of the third signal.

In another aspect of the present invention, a method is provided for controlling the optical output intensity of a laser diode. The laser diode receives current from a pulse current supply and a bias current supply. The method includes receiving a portion of the optical output of the laser diode and delivering a first signal having a magnitude proportional to the optical intensity of the laser diode optical output. The method also includes detecting the magnitude of the first signal corresponding to the minimum magnitude of the optical output and delivering a second signal having a magnitude corresponding to the minimum magnitude of the optical output. The magnitude of the second signal is compared to a preselected magnitude and the magnitude of the bias current is altered in response to the second signal differing from the preselected magnitude.

BRIEF DESCRIPTION OF THE DRAWING

Other advantages of the invention will become apparent upon reading the following detailed description and upon reference to the drawing in which:

FIG. 2 is a graphical representation of laser diode drive current versus optical output intensity of a laser diode operating at various preselected temperatures and controlled by the mean optical output level;

FIG. 6 is a graphical representation of laser diode drive current versus optical output intensity of a laser diode operating at various preselected temperatures and controlled by the trough current level.

Figure 1:
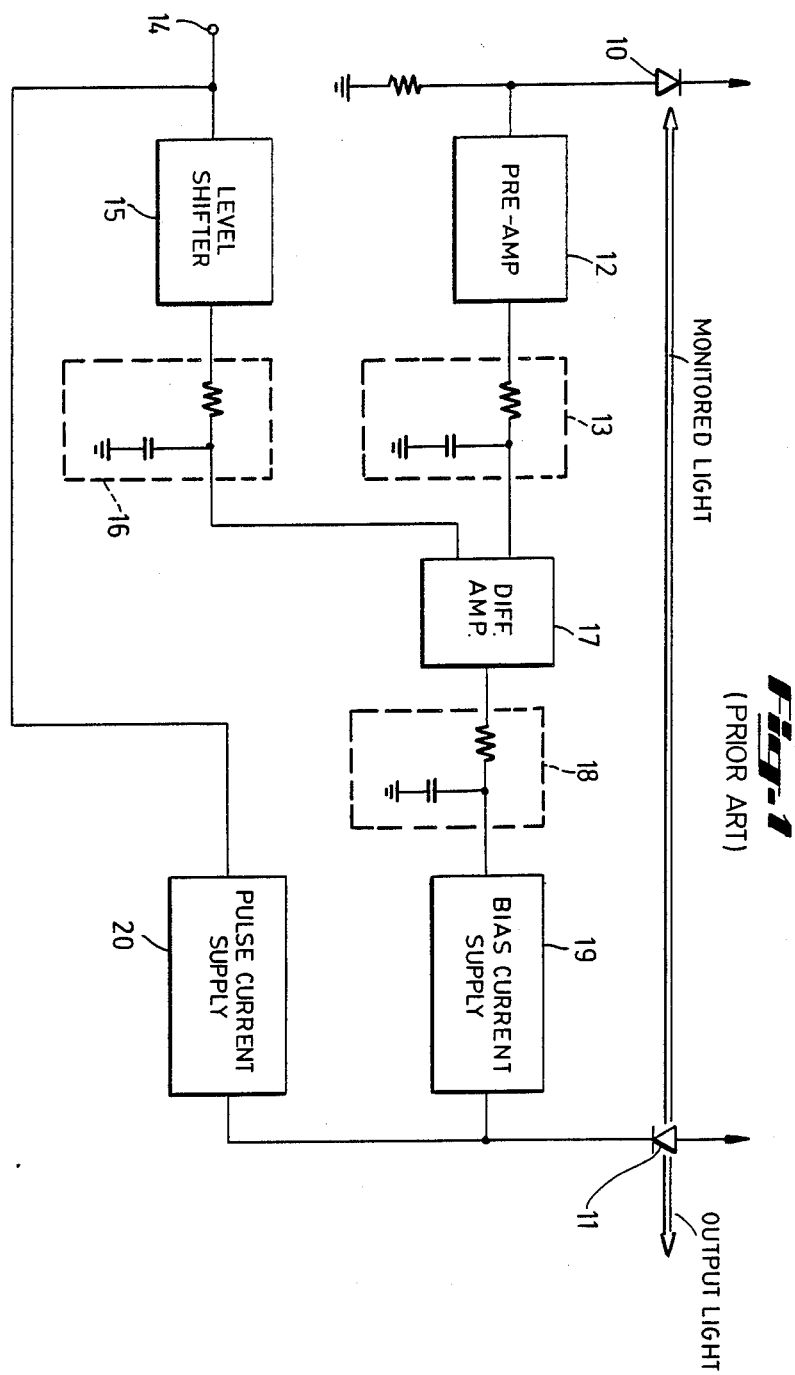
FIG. 1 is an electrical schematic of a prior art automatic power control for a laser diode.

While the invention is susceptible to various modifications and alternative forms, specific embodiments thereof have been shown by way of example in the drawing and will herein be described in detail. It should be understood, however, that there is no intention to limit the invention to the particular forms disclosed, but on the contrary, the intention is to cover all modifications, equivalents, and alternatives falling within the spirit and scope of the invention as defined by the appended claims.

DESCRIPTION OF THE PREFERRED EMBODIMENT

Turning now to the drawing and referring first to FIG. 1, an electrical schematic of a typical prior art automatic power control is shown. Such prior art devices ordinarily control the laser diode bias current via a mean (time-averaged) level detection and control system.

A photodiode 10 receives a portion of the optical output of a laser diode 11 and detects the intensity of that optical output. The output current of the photodiode 10 is delivered through a pre-amplifier 12 and time-averaged by an integration circuit 13.

Digital data supplied to a data input terminal 14 is converted to a signal that has a suitable ratio for the signal low/high level analogous to the optical extinction ratio. This conversion is accomplished by a level shifter 15. An integration circuit 16 time-averages the level shifted signals in substantially the same manner as the integration circuit 13.

The output of the integration circuit 13 corresponds to the time-averaged optical output intensity of the laser diode 11. Similarly, the output of the integration circuit 16 corresponds to the time-averaged value of the digital input data pattern, such as mark/(mark+space). The outputs of the integration circuits 13, 16 are compared by a differential amplifier 17 and the difference of these two voltages is amplified and delivered to an integration circuit 18. The integration circuit 18 is necessary because of the possible timing difference between the two inputs of the differential amplifier 17. This timing difference is principally caused by the difference between the time constants of the integration circuits 13, 16.

Figure 5:
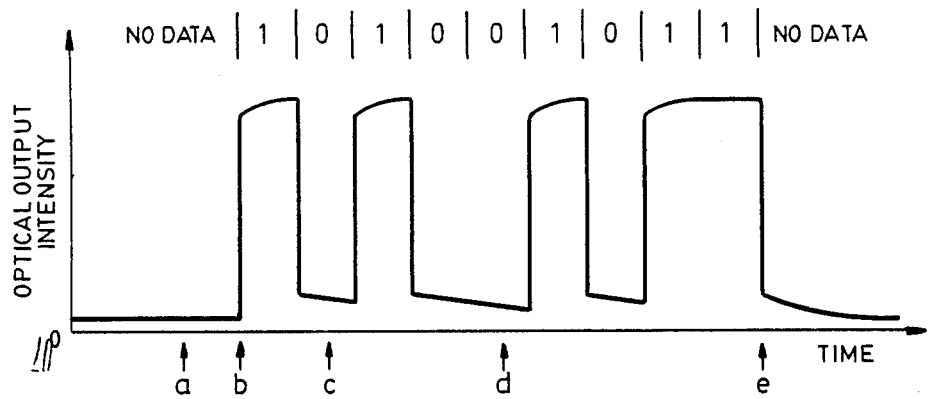
FIG. 5 is a graphical representation of the output of the laser diode during a data burst.

It should be appreciated that the data delivered to data input terminal 14 is serial in nature and can take on the form of any combination of ones and zeros. For example, FIG. 5 illustrates one such typical serial data (i.e., 101001011). If the transmission system were limited to transmitting a simple 101010 pattern, then the level shifter 15 and integration circuit 16 would be unnecessary. Rather, the level shifter 15 and integration circuit 16 could be replaced by a preselected reference voltage, since the average signal would be known. However, where the serial transmission of data can take on any form, then the average optical output intensity will be a function of the serial data being transmitted. For example, at time "d" in FIG. 5, the serial data being transmitted is two consecutive zeros. This, of course, causes the average value of the data signal to decrease; whereas, at time "e" of FIG. 5 the serial data being transmitted consists of two consecutive ones, thereby causing the average optical output intensity to increase. Thus, the level shifter 15 and integration circuit 16 constantly adjust the average optical output intensity to correspond to the particular data being transmitted at that instant.

Referring again to FIG. 1, the output of the integration circuit 18 drives a bias current supply 19, which controls the bias current delivered to the laser diode 11. Data delivered to the data input terminal 14 is also used to drive a pulse current supply 20. The output current of the bias current supply 19 and the pulse current supply 20 combine to drive the laser diode 11. The circuit controls the bias current of the laser diode 11 so that the time-averaged optical output intensity of the laser diode 11 is approximately proportional to the mark/(mark+space) of the digital input data. In other words, the pulse current supply 20 consistently delivers a controllable duty cycle signal that has a constant amplitude, but this constant amplitude variable duty cycle signal is shifted in magnitude according to the magnitude of the bias current provided by the bias current supply 19. Thus, the bias current supply 19 supplies a DC offset to the variable duty cycle constant magnitude pulse current. It should be appreciated that the pulse width corresponding to any single bit of data is constant, but consecutive bits of data give the appearance of a variable duty cycle signal.

A better appreciation of the operation of the prior art device and its shortcomings may be had by reference to the graphic representation illustrated in FIG. 2. FIG. 2 shows three characteristic curves of optical output intensity versus drive current for three respective temperatures, low "u," medium "v," and high "w." It can be seen that as the temperature of the laser diode increases from the low temperature characteristic curve "u" to the high temperature characteristic curve "w," the same time-averaged optical output intensity can only be produced by increasing the bias current. This increased bias current is, of course, accomplished by the feedback path through the photodiode 10. As the temperature increases the optical intensity decreases, causing the differential amplifier 17 to increase the bias current and restore the desired time-averaged optical intensity.

The bias currents corresponding to the low, medium, and high temperature characteristic curves are illustrated below the characteristic curves "u," "v," "w," and are indicated respectively as Ibu, Ibv, Ibw. As the dashed lines indicate, the bias currents Ibu, Ibv, Ibw correspond to the output optical intensity $P_{low}$ when no data is being delivered to the data input terminal 14. $P_{low}$ corresponds to the low (minimum) level of the output signal of the level shifter 15.

Conversely, when data is being delivered over the optical communication system, the integration circuit 16 time-averages the data signal delivered to the input terminal 14. Previously, when no data was being delivered, the integration circuit 16 responded to the lack of a data input signal on the input terminal 14 and delivered a minimum signal to the differential amplifier 17. This resulted in the bias current Ibu, Ibv, Ibw being supplied by the bias current supply 19. Now, however, the presence of data on the input terminal 14, causes the integration circuit 16 to produce the time-averaged voltage of that data input signal and deliver it to the differential amplifier 17.

The pulse current supply 20 responds to the data input signal and begins driving the laser diode 11. The photodiode 10 responds to optical output of the laser diode 11 by producing an electric signal that is amplified by the preamplifier 12, time-averaged by the integration circuit 13, and delivered to the differential amplifier 17. The differential amplifier 17 delivers a signal through the integration circuit 18 to control the bias current supply 19 to match the average optical output intensity to the average level of the data signal on the input terminal 14. This results in the bias current Ibu, Ibv, Ibw being supplied by the bias current supply 19. Thus, it can be seen that the bias current Ibu, Ibv, Ibw supplied to the laser diode 11 during the absence of data, and the bias current Ibu', Ibv', Ibw' supplied to the laser diode 11 during the presence of data do not necessarily coincide.

The gradient of the characteristic curves corresponds to the differential quantum efficiency of the radiation. In general, the differential quantum efficiency decreases as the temperature rises. Therefore, if the amplitude of the pulse current is constant, the amplitude of the optical output decreases as the temperature goes up, and the amplitude of the optical output increases as the temperature goes down. Therefore, at low operating temperatures the bias current Ibu supplied to the laser diode 11, during the absence of data on the input terminal 14, is greater than the bias current Ibu' supplied during the transmission of data. However, at medium operating temperatures, the bias current Ibv supplied during the absence of data is approximately the same as the bias current Ibv' supplied during the transmission of data. Conversely, at high operating temperatures the bias current Ibw, supplied during the absence of data, is lower than the bias current Ibw' supplied during the transmission of data. The practical effect of these variations is a short period of unpredictable response during the transition from no transmitted data to the presence of transmitted data.

Figure 3A:
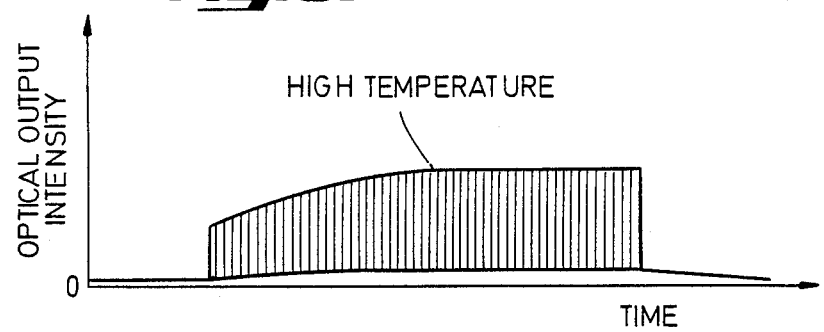
FIG. 3 is a graphical representation of the laser diode burst signal response characteristics for various preselected temperatures.

This effect can be seen more clearly by reference to FIG. 3 where the laser diode optical output intensity is shown graphically related to time for high, medium, and low temperatures. In particular, at FIG. 3A the graphical representation of optical output intensity versus time for a data burst at high temperature is shown. It should be appreciated that since the bias current Ibw during the absence of data is lower than the bias current Ibw' during the presence of data, the optical output intensity of the laser diode is initially lower than the desired level.

Figure 3B:
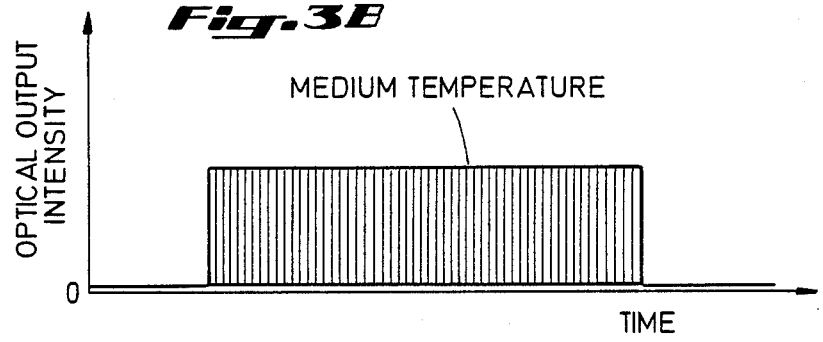
Figure 3C:
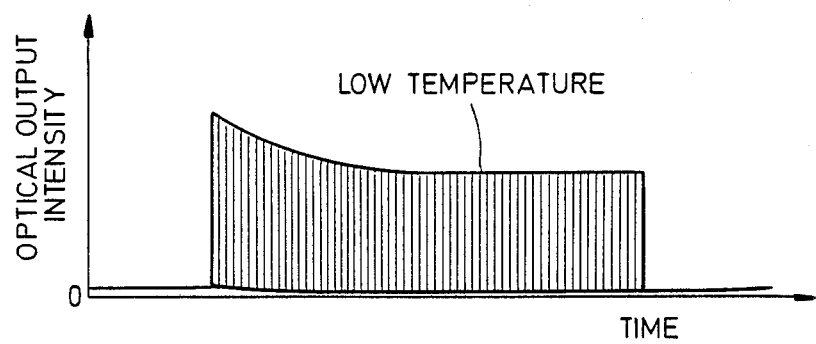

Whereas, at medium operating temperatures the bias currents Ibv, Ibv' during the absence and presence of data respectively are approximately the same, the optical output intensity of the laser diode is substantially constant throughout the data burst time period, as shown in FIG. 3B. On the other hand, during low temperature operation the bias current Ibu, during the absence of data, is significantly greater than the bias current Ibu' during the presence of data. Therefore, as shown is FIG. 3C, the optical output intensity is temporarily greater than the desired optical output intensity during an initial data burst time period. Thus, the integrity of data being transmitted at the beginning of a data burst is significantly reduced over data that is transmitted later in the data burst time period.

Further, in FIG. 2 the waveforms for low, medium, and high operating temperatures are shown to the right of the operating characteristic curve "u," "v," "w" and are generally indicated by Lu, Lv, Lw. Since the circuit controls the bias current supply so that the time-averaged optical power coincides with $P_{ave}$, each of the waveforms Lu, Lv, Lw are centered about the average optical output intensity $P_{ave}$. Further, the extinction ratio is seen to increase with corresponding increasing temperature. This is a result of the circuit controlling the bias current in order to maintain the average optical output. For example, at low operating temperature Ibu exceeds Ibu' and the minimum optical output intensity is less than $P_{low}$. However, the maximum output optical intensity must correspondingly increases by a similar value, thereby resulting in a very small extinction ratio.

On the other hand, at high operating temperatures Ibw' exceeds Ibw. Thus, the minimum optical output intensity exceeds $P_{low}$ and the maximum output intensity is correspondingly reduced by a similar amount. It should be appreciated that at medium operating temperatures, the optical output waveform is centered about $P_{ave}$ and the minimum optical output intensity corresponds to $P_{low}$.

Figure 4:
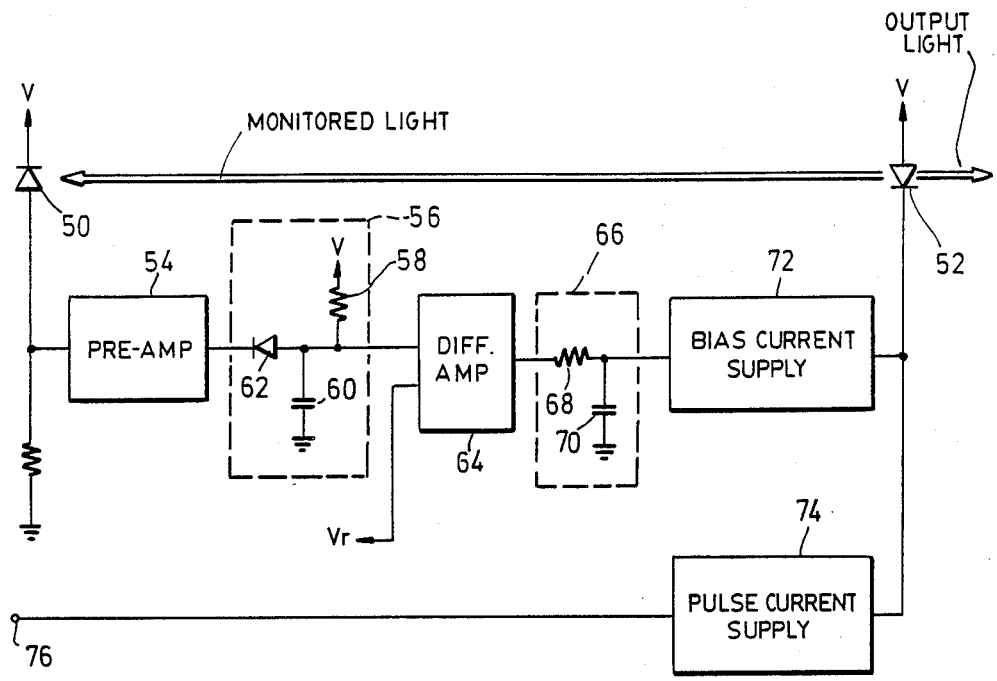
FIG. 4 is an electrical schematic of the instant apparatus.

Referring now to FIG. 4, an electrical schematic of the instant apparatus is illustrated. A photodiode 50 receives a portion of the light delivered by the laser diode 52. The photodiode 50 delivers an output that has a magnitude proportional to the intensity of the light delivered by the laser diode 52. A preamplifier 54 receives and amplifies the output from the photodiode 50.

The output of the preamplifier 54 is delivered to a low level detecting means 56. The low level detecting means 56 operates to store the minimum magnitude of the signal delivered by the preamplifier 54. In other words, the low level detecting means 56 detects and stores the trough level of the photodiode output. The low level detecting means 56 includes a resistor 58 connected to a positive source of voltage V and to ground through a storage capacitor 60. A diode 62 has its cathode connected to the preamplifier 54 and its anode connected to the junction of the resistor 58 and capacitor 60.

In this manner, when the voltage level of the preamplifier output signal falls to a value less than the voltage stored by the capacitor 60, the diode 62 is biased "on" and conducts current to the preamplifier 54, thereby providing a discharge path for the capacitor 60. The capacitor 60 discharges to a value corresponding to the lowest voltage level of the preamplifier output signal. Therefore, it can be seen that the voltage level stored at the capacitor 60 corresponds to the trough voltage level of the photodiode output signal.

During a subsequent pulse, the laser diode output may have shifted, owing to changes in operating temperature. The voltage level stored in the capacitor 60 likewise shifts to match this new trough level.

The voltage level signal stored in the capacitor 60 is delivered to one input of a differential amplifier 64. The second input to the differential amplifier 64 is connected to a source of reference voltage $V_r$, where the reference voltage $V_r$ represents the preselected desired trough level of the laser diode output signal. The two inputs to the differential amplifier 64 are connected so that an increase in the low level of the optical output intensity of the laser diode 52 causes a decrease in the bias current provided to the laser diode 52.

An integration circuit 66 is connected to the output of the differential amplifier 64 and includes a resistor 68 and capacitor 70 connected to system ground. The integration circuit 66 obtains stable operation of the overall circuit.

The output of the integration circuit 66 is connected to drive a bias current supply 72, which is connected to the laser diode 52. Also, a pulse current supply 74 is shown connected to a data input terminal 76 and to the laser diode 52. The output currents of the bias current supply 72 and pulse current supply 74 combine to drive the laser diode 52.

It should be appreciated that the photodiode 50, the preamplifier 54, the low level detecting means 56, the differential amplifier 64, the integration circuit 66, the bias current supply 72 and the laser diode 52 forms a closed bias current control loop. It should also be appreciated that the integration circuit 66 is employed as a means to slow the response of the the closed bias current control loop.

When the optical output intensity of the laser diode 52 is "high," the output voltage of the low level detecting means 56 increases because the output voltage of the preamplifier 54 is greater than the output voltage of the low level detecting means 56. Therefore, the bias current provided to the laser diode 52 decreases and the optical output intensity of the laser diode 52 decreases.

The aforementioned stable operation is achieved by selection of the components in the integration circuit 66 and low level detecting means 56 such that the magnitude of the above-mentioned voltage increase of the output of the low level detecting means 56, during the period of time when the optical output of the laser diode 52 is "high," exceeds or is equal to the amount of voltage decrease of the output of the preamplifier 54 caused by the above-mentioned decrease of the optical output intensity of the laser diode 52 during this same period of time. This requirement is deduced assuming that the optical output waveform is a square wave with a duty cycle of 50%. The rise in voltage of the low level detecting means 56 produces a corresponding reduction in the output of the differential amplifier 64. This reduced output, of course, would undesirably reduce the bias current and optical output intensity of the laser diode 52 if passed directly to the bias current supply 72. The integration circuit 66, however, operates to slow the decreasing output from the differential amplifier 64.

Moreover, the low level detecting means 56 can produce undesirable overshoot. For example, if the bias current of the laser diode 52 decreases during the time period when the optical output is "high" so that the optical output during the period of time when it is "low" falls below the desired low level optical output intensity, the low level detecting means 56 produces an output signal that corresponds to this change. The low level detecting means 56 and differential amplifier 64 operate to increase the bias current supplied to the laser diode 52 even after the optical output intensity of the laser diode 52 has been increased to its desired level if the rate of increase of the output level of the low level detecting means 56 is smaller than the requirement stated above. Therefore, by adjusting the increase rate of the output of the low level detecting means 56 and the response of the bias current control loop, stability is achieved.

It should be appreciated that if the preamplifier 54 is an inverting amplifier, a high level detecting means or a peak hold circuit should replace the low level detecting means 56. It should also be appreciated that the differential amplifier 64 should be replaced by a summing amplifier if the polarity of the output voltage of the low level detecting means does not match the polarity of the reference voltage $V_r$.

Operation of the circuit of FIG. 4, may best be appreciated by a brief discussion of several exemplary modes of operation. For example, during operation when the ambient temperature is low or the circuit is first put into use, the temperature of the laser diode 52 is much closer to the low temperature operating characteristic curve "u" of FIG. 6. FIG. 6 is a graphical representation of optical output intensity versus drive current, similar to that shown in FIG. 2. Accordingly, the trough level optical intensity of the laser diode 52 is maintained by a relatively low level bias current. Thus, a portion of the laser diode optical signal is received by the photodiode 50, which delivers an output signal of a proportional magnitude. The preamplifier 54 delivers this signal to the low level detecting means 56, causing the capacitor 60 to discharge through the reverse biased diode 62 to a corresponding voltage level. Ordinarily, the voltage level of capacitor 60 substantially matches the reference voltage $V_r$. Thus, the output of the differential amplifier is zero and no affect is had on the bias current supply 72.

However, when the ambient temperature is medium or high or when the temperature level of the laser diode 52 rises to a medium or high temperature level with continued operation of the circuit, such that the bias current required to produce the low level optical output intensity from the laser diode 52, is increased, as shown in FIG. 6 by characteristic curves "v" and "w". Thus, the photodiode 50 responds to this reduced optical intensity by producing a proportionally reduced output signal to the preamplifier 54. The capacitor 60 discharges to a correspondingly lower level through the diode 62 to match the trough level of the photodiode signal. In this case, the reference voltage $V_r$ exceeds the voltage level on the capacitor 60 so that the differential amplifier produces a voltage signal corresponding to the difference. The integration circuit 66 responds by ramping from its current value toward the differential voltage supplied by the differential amplifier 64. This change in voltage is communicated to the bias current supply 72, which operates to increase the bias current supplied to the laser diode 52, thereby correspondingly increasing the optical output intensity. When the optical output intensity 52 reaches the value corresponding to the desired trough level, the photodiode current correspondingly increases so that the low level detecting means 56 has its capacitor 60 charged to a value corresponding to the reference voltage $V_r$. It can be seen that no further adjustment to the bias current supply 72 is accomplished unless the trough level optical output intensity varies owing to a change of temperature or age.

It can be seen that since the instant apparatus controls the trough level of the laser diode output, the bias current during both the presence and absence of data are identical. Thus, at low, medium, and high operating temperatures the bias currents Ibu, Ibv, Ibw during the absence of data correspond to the bias currents Ibu', Ibv', and Ibw' during the presence of data. Thus, the optical output intensity response to data burst is ideal and corresponds graphically to the optical output intensity response to data burst illustrated in FIG. 3B.

Since the circuit controls the trough level of the optical output intensity, the extinction ratios for all operating temperatures are substantially similar. It should be appreciated that the low levels of the waveforms, Lu, Lv, Lw are shown as being identical, but high levels of the waveforms will vary owing to corresponding variation in differential quantum efficiency, which is proportional to the gradient of the laser diode characteristic curve. However, substantially constant extinction ratio can be obtained by temperature compensating the magnitude of the pulse current. Thus, the extinction ratio is substantially independent of the operating temperature.

Referring now to FIG. 5, a graphical representation of the output of the laser diode during a data burst is shown for more precise explanation of the instant invention. The low level detecting means 56 detects the level corresponding to the optical output level when no data signal provided. In FIG. 5, no data signal has been provided before time "b." At time "a," the low level detecting means 56 provides the level corresponding to the optical output level at time "a." The data signal (101001011) begins at time "b" and ends at time "e." Due to the limited frequency response of the circuit and devices, optical output intensity at time "c" and at time "d" are different from that at time "a" even if the bias current is constant. The low level detecting means 56 is designed so that it provides the same level as the optical level when no data signal is provided, rather than the real optical low level. This is possible by adjusting the frequency response or overshoot characteristics of the preamplifier 54 or other element in the low level detecting means 56.

I claim:

1. An apparatus for controlling the optical output intensity of a laser diode used in an optical communication system to periodically transmit data, wherein said laser diode receives current from a pulse current supply and a bias current supply, comprising:
   first means for receiving a portion of the optical output of said laser diode and delivering a first signal having a magnitude proportional to the optical intensity of said laser diode optical output;
   second means for receiving said first signal, detecting the magnitude corresponding to the minimum magnitude of said optical output, and delivering a second signal having a magnitude corresponding to said minimum magnitude of said optical output; and
   third means for comparing the magnitude of said second signal to a preselected magnitude and altering the magnitude of said bias current in response to said second signal differing from said preselected magnitude, independent of the presence and absence of data being transmitted.

2. An apparatus, as set forth in claim 1, wherein said first means includes a photodiode adapted to receive at least a portion of the optical output of said laser diode.

3. An apparatus, as set forth in claim 1, wherein said second detecting means includes a resistor and capacitor connected in series with a source of voltage, and a diode having a first electrode connected to the junction of said resistor and capacitor and a second electrode adapted to receive said first signal.

4. An apparatus, as set forth in claim 3, wherein said third means includes an amplifier having a first input connected to the junction of said resistor and capacitor, a second input connected to a reference voltage of a preselected magnitude, and an output connected to said bias current supply.

5. An apparatus, as set forth in claim 4, including an integration circuit connected intermediate said amplifier output and said bias current supply.

6. An apparatus, as set forth in claim 4, wherein said first means includes a preamplifier having a preselected response time during the transition of said pulse current supply from a low to high magnitude and said low level detecting means having a time constant at least equal to said preamplifier response time.

7. An apparatus for controlling the optical output intensity of a laser diode used in an optical communication system to periodically transmit data, wherein said laser diode receives current from a pulse current supply and bias current supply, comprising:
   first means for receiving a portion of the optical output of said laser diode and delivering a first signal having a magnitude proportional to the optical intensity of said laser diode optical output;
   second means for receiving said first signal, detecting the magnitude corresponding to the minimum magnitude of said optical output, and delivering a second signal having a magnitude corresponding to said minimum magnitude of said optical output;
   third means for comparing the magnitude of said second signal to a preselected magnitude and delivering a third signal having a magnitude corresponding to the magnitude of the difference between said second signal and said preselected magnitude; and
   fourth means for receiving the third signal and altering the magnitude of said bias current corresponding to the magnitude of said third signal, independent of the presence and absence of data being transmitted.

8. An apparatus, as set forth in claim 7, wherein said first signal delivering means includes a photodiode adapted to receive at least a portion of the optical output of said laser diode.

9. An apparatus, as set forth in claim 7, where said minimum magnitude detecting means includes a resistor and capacitor connected in series with a source of voltage, and a diode having an anode connected to the junction of said resistor and capacitor and a cathode adapted to receive said first signal.

10. An apparatus, as set forth in claim 9, wherein said third means includes a differential amplifier having a first input connected to the junction of said resistor and capacitor, a second input connected to a reference voltage of a preselected magnitude, and an output connected to said bias current supply.

11. An apparatus, as set forth in claim 10, wherein said fourth means includes an integration circuit connected intermediate said differential amplifier output and said bias current supply.

12. An apparatus, as set forth in claim 11, wherein said integration circuit has a time constant at least equal to the time constant of said minimum magnitude detecting means.

13. An apparatus, as set forth in claim 10, wherein said first means includes a preamplifier having a preselected response time during the transition of said pulse current supply from a low to high magnitude and said low level detecting means have a time constant at least equal to said preamplifier response time.

14. An apparatus for controlling the optical output intensity of a laser diode used in an optical communication system to periodically transmit date, wherein said laser diode receives current from a pulse current supply and a bias current supply, comprising:
   means for receiving a portion of the optical output of said laser diode and delivering a first signal having a magnitude proportional to the optical intensity of said laser diode optical output;
   means for receiving said first signal, detecting the minimum magnitude of said first signal, and delivering a second signal having a magnitude corresponding to said first signal minimum magnitude;
   means for comparing the magnitude of said second signal to a preselected magnitude and delivering a third signal having a magnitude corresponding to the magnitude of the difference between said second signal and said preselected magnitude; and
   an integration circuit adapted for receiving the third signal and altering the magnitude of said bias current corresponding to the magnitude of said third signal, independent of the presence and absence of data being transmitted.

15. An apparatus, as set forth in claim 14, wherein said first signal delivering means includes a photodiode adapted to receive at least a portion of the optical output of said laser diode.

16. An apparatus, as set forth in claim 14, where said minimum magnitude detecting means includes a resistor and capacitor connected in series with a source of voltage, and a diode having an anode connected to the junction of said resistor and capacitor and a cathode adapted to receive said first signal.

17. An apparatus, as set forth in claim 16, wherein said comparing means includes a differential amplifier having a first input connected to the junction of said resistor and capacitor, a second input connected to a reference voltage of a preselected magnitude, and an output connected to said bias current supply.

18. An apparatus, as set forth in claim 16, wherein said first means includes a preamplifier having a preselected response time during the transition of said pulse current supply from a low to high magnitude and said low level detecting means have a time constant at least equal to said preamplifier response time.

19. A method for controlling the optical output intensity of a laser diode used in an optical communication system to periodically transmit data, wherein said laser diode receives current from a pulse current supply and a bias current supply, the method comprising the steps of:
   receiving a portion of the optical output of said laser diode and delivering a first signal having a magnitude proportional to the optical intensity of said laser diode optical output;
   detecting the magnitude of said first signal corresponding to the minimum magnitude of said optical output and delivering a second signal having a magnitude corresponding to said minimum magnitude of said optical output;
   comparing the magnitude of said second signal to a preselected magnitude; and
   altering the magnitude of said bias current in response to said second signal differing from said preselected magnitude, independent of the presence and absence of data being transmitted.

20. An optical communication device, comprising:
   (a) a light-emitting diode connected to receive current from a current source and to produce an optical output related thereto, the current source periodically supplying pulse current to transmit data and continuously supplying bias current;
   (b) a detector generating an output signal related to the magnitude of said optical output of said diode at the minimum level of said optical output;
   (c) a comparator responsive to the difference between said output signal and a reference value to generate a difference signal, said current source being adjusted to vary said bias current in response to said difference signal whether or not said said diode is receiving said pulse current to transmit data.

21. A device according to claim 20 wherein said light-emitting diode is a laser.

22. A method of controlling a light-emitting diode, comprising the steps of:
   (a) a driving said diode by current to produce an optical output, said current including pulse current to transmit data periodically and including a continuous bias current;
   (b) generating an output signal related to the magnitude of said optical output of said diode at the minimum level of said optical output;
   (c) detecting the difference between said output signal and a reference value to generate a difference signal, and adjusting said bias current in response to said difference signal whether or not said said diode is receiving said pulse current to transmit data.

23. A method according to claim 22 wherein said light-emitting diode is a laser.

* * * * *